United States Patent [19]

Lee et al.

[11] Patent Number: 5,374,584
[45] Date of Patent: Dec. 20, 1994

[54] METHOD FOR ISOLATING ELEMENTS IN A SEMICONDUCTOR CHIP

[75] Inventors: Chang-Jae Lee; Hee-Sik Yang, both of Seoul, Rep. of Korea

[73] Assignee: Goldstar Electron Co. Ltd., Cheongju, Rep. of Korea

[21] Appl. No.: 89,868

[22] Filed: Jul. 12, 1993

[30] Foreign Application Priority Data

Jul. 10, 1992 [KR] Rep. of Korea ............. 1992-12254

[51] Int. Cl.⁵ .................................................. H01L 21/76
[52] U.S. Cl. ............................................ 437/69; 437/70; 437/72; 437/73
[58] Field of Search ........................ 437/69, 70, 72, 73

[56] References Cited

U.S. PATENT DOCUMENTS

| 4,508,757 | 4/1985 | Fabricius et al. | 437/72 |
| 4,637,128 | 1/1987 | Mizutani | 29/576 |
| 4,800,417 | 1/1989 | Kato | 357/59 |
| 4,833,098 | 5/1989 | Kato | 437/38 |
| 5,149,669 | 9/1992 | Hosaka | 437/72 |

FOREIGN PATENT DOCUMENTS

| 0424018 | 4/1991 | European Pat. Off. | |
| 0250808 | 10/1987 | Germany | 437/69 |
| 0100944 | 5/1986 | Japan | 437/69 |
| 0247051 | 11/1986 | Japan | 437/72 |
| 0090150 | 4/1988 | Japan | 437/69 |
| 0217639 | 9/1988 | Japan | 437/69 |
| 0217640 | 9/1988 | Japan | |
| 0253640 | 10/1988 | Japan | 437/72 |
| 0067938 | 3/1989 | Japan | 437/72 |

*Primary Examiner*—Brian D. Hearn
*Assistant Examiner*—Trung Quoc Dang

[57] ABSTRACT

A method for isolating elements in a silicon semiconductor device is disclosed. The invention discloses the steps of: (1) forming a thermal silicon oxide layer on a silicon substrate, depositing a layer of polysilicon, and depositing a first silicon nitride layer thereon, (2) patterning an active region and a field region, and etching the thermal oxidation layer, the polysilicon layer and the first silicon nitride layer on the field region to forth an active region pattern, (3) depositing a second silicon nitride layer, and, thereupon, depositing a silicon oxide layer, (4) etching back the oxide layer by application of a reactive ion etch technique, forming a silicon oxide side wall on the side of the active region pattern, and etching back the second silicon nitride layer using the oxide side wall as a mask to expose the silicon substrate, (5) removing the oxide side wall, and performing a channel stop field ion implantation, and (6) performing a field oxidation process to form a field oxide layer.

18 Claims, 3 Drawing Sheets

METHOD FOR ISOLATING ELEMENTS IN A SEMICONDUCTOR CHIP

FIELD OF THE INVENTION

The present invention relates to a method for isolating elements in a semiconductor chip having a silicon substrate, and more particularly to a method for electrically isolating individual elements from one another in a semiconductor chip that is suitable for manufacturing a CMOS type semiconductor memory device of a high density.

BACKGROUND OF THE INVENTION with conventional techniques; there typically is provided a wafer generally prepared for a MOS (metal oxide silicon) semiconductor device. For isolating active areas of the device elements, as shown in FIG. 1(a), pad silicon oxide layer 11 is formed by application of a thermal oxidation process in order to relieve stress created during field oxidation, which is induced in silicon substrate 10 due to the difference of thermal expansion between a later-formed silicon nitride layer and silicon substrate 10. The stress relief is provided by utilizing the thermal viscous flow of the silicon oxide layer.

Then, silicon nitride layer 12 is formed by application of a low pressure chemical vapor deposition process to prevent the oxidation of silicon substrate 10 during field oxidation.

Thereafter, a photo etching process is applied to pattern silicon nitride layer 12 and pad silicon oxide layer 11, and the resulting pattern distinguishes areas where unit elements are to be formed (active regions) and areas where isolating layers (field oxide) are to be formed (field regions) (for clarity, the figures and the discussion refer sometimes to "active region" and "field region", although, as is known in the art, in actual devices a plurality of action and field regions are formed on the substrate). Then, a first field ion implantation process is carried out into field surface regions of silicon substrate 10 (the ion implanted regions being indicated by a dashed line in FIG. 1).

Next, as shown in FIG. 1(b), second silicon nitride layer 13 is deposited in a thin thickness, and CVD (chemical vapor deposition) $SiO_2$ layer 14 is deposited to self align a thin offset nitride layer extending from the active nitride layer on the active region.

Then, as shown in FIG. 1(c), $SiO_2$ layer 14 is etched back to form CVD $SiO_2$ side wall 14a, and second silicon nitride layer 13 is etched back. Silicon substrate 10 is further etched to a shallow depth as illustrated. Thereafter, a second field ion implantation process is performed to form channel stop doping on the etched lower region.

Next, as shown in FIG. 1(d), silicon oxide side wall 14a is stripped by immersion in an etching solution (such as HF). Then as shown in FIG. 1(e), the field oxidation process is performed to grow field oxide layer 15, thereby completing the isolation process. After these steps, a normal MOS type semiconductor manufacturing process is carried out.

Such a conventional technique has a number of disadvantages. The thickness of the nitride layer has to be over 2000 Angstroms in order to secure the height difference which is needed to form the side wall which is in turn required to self align the offset nitride for extending the silicon nit ride layer of the active silicon nitride layer to beneath the side wall. Accordingly, the thickness of the pad silicon oxide layer which is provided for stress-relieving during the field oxidation typically has to be over 500 Angstroms in thickness. After the field oxidation, the silicon nitride layer is removed, and the silicon oxide layer of the active region has to be removed by at least500 Angstroms, and consequently, damage to the silicon oxide layer of the field region can become severe.

Further, for growth of the field oxide layer, the thickness of the field oxide layer has to be very large if there is to be secured a proper threshold voltage (Vth) for the field transistor which uses the field oxide between the active regions as the gate oxide. Consequently, a large amount of stress is built up during the field oxidation, with the possible consequence that crystal defects may occur.

In addition, a thick silicon nitride layer is used as the oxidizing mask, and, therefore, this can result in crystal defects in the silicon substrate. As a result, the electrical characteristics and the reliability of the device as well as the manufacturing yield of the products may be impaired.

SUMMARY OF THE INVENTION

Therefore it is an object of the present invention to provide a method for isolating individual elements in a semiconductor device which is intended to overcome the above described disadvantages of the conventional techniques.

In achieving the above object, the method of the present invention provides for the steps of: (1) thermally oxidizing the silicon substrate by using an $O_2$ gas or a mixture of $H_2$ and $O_2$ gases to form a thin silicon oxide layer, depositing a polycrystalline silicon film by applying a chemical deposition process, and depositing a first silicon nitride layer by application of a chemical vapor deposition process; (2) performing a photo etching process to define an active region and a field region, and etching the thermal silicon oxide layer, the polycrystalline silicon layer and the first silicon nitride layer on the field region so that those layers remain on the active region; (3) forming a second silicon nitride layer of a thin thickness by application of a chemical vapor deposition process, and depositing a silicon oxide layer by application of a chemical vapor deposition process; (4) forming a side wall of the silicon oxide on the side of the active region pattern by a reactive ion etching technique, and etching the second silicon nitride layer using the silicon oxide side wall as a mask; (5) etching the side wall to remove it, and performing a channel stop field ion implantation in one step; and (6) performing a field oxidation process to form a field oxide layer.

Desirably, after formation of the silicon oxide side wall, the second silicon nitride layer and a part of the silicon substrate are etched back using the silicon oxide side wall as a mask and by application of a reactive ion etching technique, thereby forming a shallow recess on the silicon substrate.

BRIEF DESCRIPTION OF THE DRAWINGS

The above object and other advantages of the present invention will become more apparent by describing in detail the preferred embodiments of the present invention with reference to the attached drawings in which.

DESCRIPTION OF THE PREFERRED EMBODIMENTS

FIGS. 2(a)-2(f) are partly sectional views illustrating the method of the present invention.

Figure 1A:
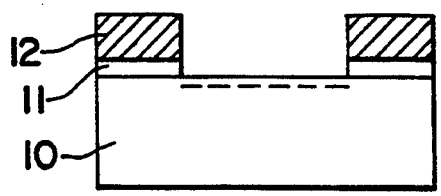
FIGS. 1(a)–1(e) illustrate the conventional process of isolating individual elements from one another in a semiconductor device.
Figure 1D:
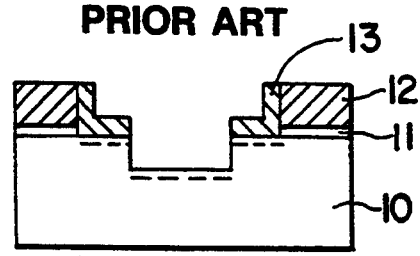
Figure 1B:
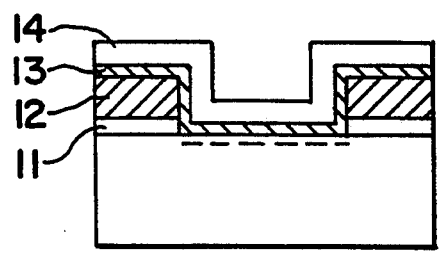
Figure 1E:
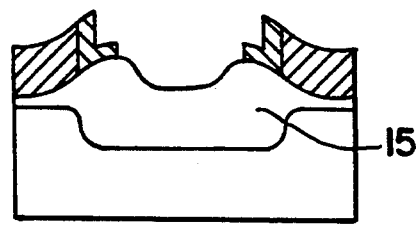
Figure 1C:
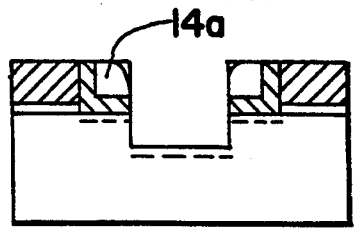
Figure 2A:
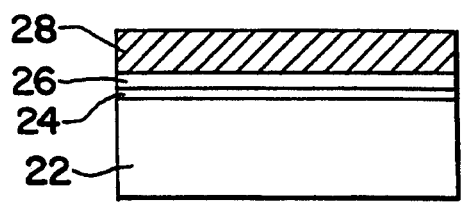
FIGS. 2(a)-2(f) illustrate a method of isolating individual elements from one another in a semiconductor device according to the present invention.

As illustrated in FIG. 2(a), thermal silicon oxide (silicon dioxide SiO₂) layer 24 is grown on silicon substrate 22 to a thickness of about 100-200 Angstroms, and a low pressure chemical vapor deposition process is performed to deposit polycrystalline silicon layer 26 to a thickness of about 500-1000 Angstroms on oxide layer 24, while also a low pressure chemical vapor deposition process is performed to deposit first silicon nitride layer 28 to a thickness of about 1500-2000 Angstroms on polysilicon layer 26.

Figure 2D:
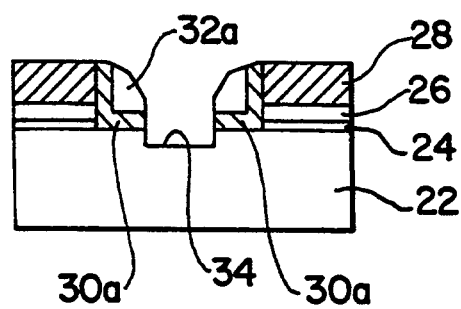
Figure 2B:
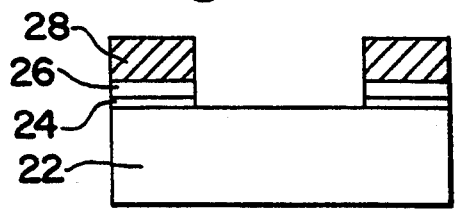

Then, as illustrated in FIG. 2(b), a field region and an active region are defined by a photo-etching process. First silicon nitride layer 28, polycrystalline silicon layer 26 and thermal silicon oxide layer 24 on the field region are etched, while silicon substrate 22 is used as an etch stop layer.

Figure 2E:
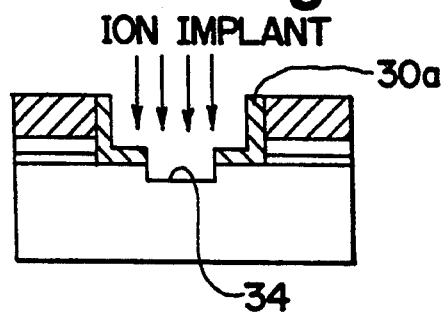
Figure 2C:
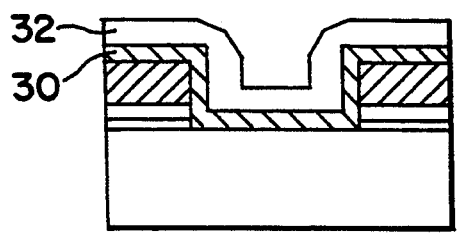

Thereafter, as illustrated in FIG. 2(c), a low pressure chemical vapor deposition process is performed to form second silicon nitride layer 30 to a thickness of about 300-700 Angstroms. Then, CVD SiO₂ is deposited to form silicon oxide layer 32.

Then, as illustrated in FIG. 2(d), silicon oxide layer 32 is etched-back to form silicon oxide layer side wall 32a, and second silicon nitride layer 30 is etched-back to form offset silicon nitride layer 30a. Then, silicon substrate 22 is etched down to form recess 34. That is, second silicon nitride layer 30 and a part of silicon substrate 22 are etched using silicon oxide layer side wall 32a as a mask and by application of a reactive ion etch technique, thereby forming a shallow recess.

Next, as illustrated in FIG. 2(e), silicon oxide layer side wall 32a is removed by etching, and a field ion implantation (I/I) is performed to form an electrical channel stop between active regions.

Figure 2F:
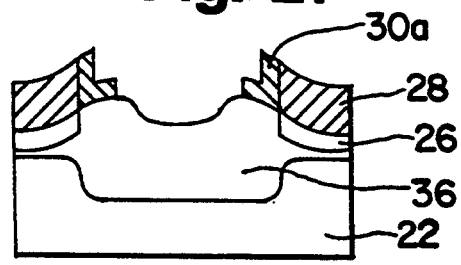

Then, as illustrated in FIG. 2(f), a thermal oxidation is performed to form field oxide layer 36 to a thickness of about 4000-6000 Angstroms. The active region is not oxidized due to the existence of silicon nitride layer 28, but the field region is oxidized, so that the active region may be isolated.

Then, silicon nitride layers 28 and 30a are removed by immersing the wafer in a hot phosphoric acid, and pad polysilicon layer 26 and base silicon oxide layer (thermal oxide layer) 24 is dry etched to be removed.

Thereafter, a conventional fabrication process for forming semiconductor devices may be carried out.

In the present invention, polysilicon layer 26 is inserted between pad silicon oxide layer 24 and silicon nitride layer 28 as the oxidation preventing layer for the active region. As a result, during the high temperature heat cycle for growing field oxide layer 36, there can be greatly alleviated the stress which occurs due to the difference between the thermal expansion of silicon nitride layer 28 and that of silicon substrate 22. Consequently, defects which can occur in the silicon substrate can be reduced, with the result that the reliability of the device as well as its electrical characteristics and the manufacturing yield can be improved.

Figure 3A:
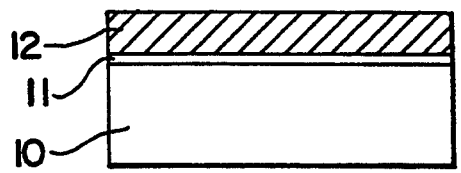
FIGS. 3(a)-3(d) illustrate the generation of stresses in both the conventional method and the method of the present invention.
Figure 3B:
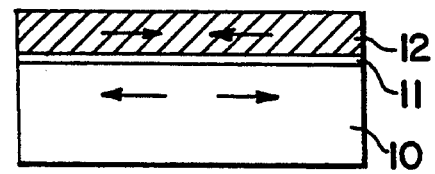
Figure 3C:
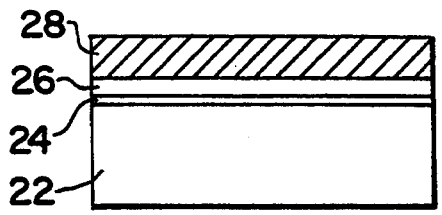
Figure 3D:
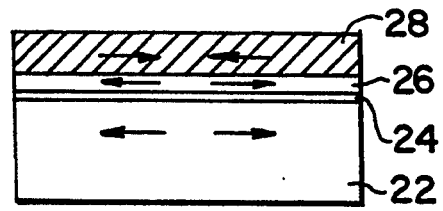

FIGS. 3(a) and 3(b) schematically illustrate the generation of stress in both the silicon nitride layer and the silicon substrate in the conventional technique, while FIGS. 3(c) and 3(d) schematically illustrate the generation of stress in the silicon nitride layer, the polysilicon layer and the silicon substrate of the present invention, as well as the stress relief provided thereby.

FIGS. 3(a) and 3(c) illustrate the state of high temperature, while FIGS. 3(b) and 3(d) illustrate the state of low temperature.

In the state of FIG. 3(a), i.e., at a high temperature, silicon nitride layer 12 is maintained as it was in the deposition source, and silicon substrate 10 is expanded due to the high temperature. The thermal expansion coefficient k is $k_{nit} < K_{si}$, ($k_{nit}$ for silicon nitride and $k_{si}$ for silicon); that is, k is larger in silicon than in silicon nitride, and therefore, as shown by arrow marks: in FIG. 3(b) at low temperature, silicon nitride layer 12 receives a compression stress due to the contraction of silicon substrate 10. Meanwhile, silicon substrate 10 is contracted, and during this process, receives an expansion stress from silicon nitride layer 12 as a reaction phenomenon.

On the other hand, according to the present invention, in the state of FIG. 3(c), i.e., at a high temperature, silicon nitride layer 28 is maintained as in the deposition source, while silicon substrate 22 and polysilicon layer 26 are expanded by the high temperature. Therefore, as shown by the arrow marks in FIG. 3(d), silicon nitride layer 28 receives a compression stress from the contraction of silicon substrate 22, and silicon substrate 22 receives an expansion stress from silicon nitride layer 28 as a reaction phenomenon. Meanwhile, polysilicon 26 layer shares the stress with silicon substrate 22 after receiving the stress from silicon nitride layer 28, thereby alleviating the stress of the silicon substrate.

Further, the height difference which is required for forming the side wall can be heightened due to the thickness of polysilicon layer 26, and therefore, the thickness of silicon nitride layer 28 can be reduced to some degree. As the thickness of silicon nitride layer 28 is reduced, the stress which is induced in silicon substrate 22 also is reduced. Further, as polysilicon layer 26 alleviates the stress, the thickness of pad silicon oxide layer 24, which also is for alleviating the stress, can be reduced to a great degree. Thus, the mentioned factors reduce the overall stress, thereby improving the characteristics which are related to crystal defects.

Further, as the thickness of the pad silicon oxide layer is small, the damage of the field oxide layer can be reduced during removal of the pad silicon oxide layer. Consequently, the threshold voltage Vth of the parasite field transistor between active regions can be improved, with the result that the isolation can be improved.

Meanwhile, by forming an offset of a thin silicon nitride layer on the side wall of the active pattern, there is reduced the "bird's beak" which occurs due to the oxidant diffusion through pad oxides during the oxidation of the field oxide.

Further, during the field ion implantation, the ions may pass through a thin silicon nitride layer, and, therefore, the bottom and the surface of the silicon substrate can be ion-implanted in one step, thereby simplifying the process. Thus, during field oxidation, the intrusion of the dopant into the active region through a side ward diffusion can be reduced, as well as improving the elements of the active region including transistors.

Although various preferred embodiments of the present invention have been disclosed for illustrative purposes, those skilled in the art will appreciate that various modifications, additions and/or substitutions are possible without departing from the scope and spirit of the present invention as disclosed in the claims.

What is claimed is:

1. A method for isolating elements in a semiconductor device comprising the steps of:
   (1) forming a thermal silicon oxide layer on a silicon substrate, depositing a polysilicon layer on the thermal silicon oxide layer, and depositing a first silicon nitride layer on the polysilicon layer;
   (2) patterning an active region and a field region, wherein the thermal silicon oxide layer, the polysilicon layer and the first nitride layer are reproved in the field region and remain in the active region;
   (3) depositing a second silicon nitride layer on the overall surface and depositing thereon a silicon oxide layer;
   (4) etching back the silicon oxide layer by a reactive ion etching technique, wherein a silicon oxide side wall is formed on the edge of the active region pattern, and etching back the second silicon nitride layer using the oxide side wall as a mask to expose a portion of the silicon substrate in the field region;
   (5) etching the exposed portion of the silicon substrate in the field region to form a recess;
   (6) removing the oxide side wall, and performing a channel stop field ion implantation; and
   (7) perforating a field oxidation to forth a field oxide layer in the field region.

2. The method of claim 1, wherein at step (4), the second silicon nitride layer and a portion of the silicon substrate are etched back using the oxide side wall as a mask by application of a reactive ion etching technique, wherein in a shallow recess is formed in the silicon substrate.

3. A method for isolating elements in a semiconductor device comprising the steps of:
   (1) forming a first insulating layer on a semiconductor substrate, and forming a polysilicon layer and a second insulating layer on the first insulating layer;
   (2) selectively removing portions of the first insulating layer, the polysilicon layer and the second insulating layer to form a field region and an active region, wherein the first insulating layer, the polysilicon layer and the second insulating layer are removed in the field region and remain in the active region;
   (3) forming a third insulating layer comprising nitride and a fourth insulating layer comprising oxide on the exposed surface, and patterning the third insulating layer and the fourth insulating layer to form a nitride-oxide sidewall along the edges of the field region and to expose the semiconductor substrate in a portion of the field region;
   (4) etching the exposed portion of the semiconductor substrate in the field region to form a recess;
   (5) removing the oxide side wall, and performing a channel stop field ion implantation into the semiconductor substrate;
   (6) performing a field oxidation to form a field oxide layer in the field region.

4. The method of claim 3, wherein the first insulating layer comprises oxide.

5. The method of claim 3, wherein the second insulating layer comprises silicon nitride.

6. The method of claim 3, wherein the third insulating layer comprises silicon nitride.

7. The method of claim 3, wherein the first insulating layer comprises silicon oxide, the second insulating layer comprises silicon nitride, and the third insulating layer comprises silicon nitride.

8. The method of claim 7, wherein the first insulating layer is formed by a thermal oxidation process, and the polysilicon layer, the second insulating layer and the third insulating layer are formed by chemical vapor deposition processes.

9. The method of claim 7, wherein the first insulating layer is of a thickness of about 100–200 Angstroms, the polysilicon layer is of a thickness of about 500–1000 Angstroms, the second insulating layer is of a thickness of about 1500–2000 Angstroms, and the third insulating layer is of a thickness of about 300–700 Angstroms.

10. The method of claim 7, wherein step (3) comprises the steps of depositing a second silicon nitride layer as the third insulating layer and depositing thereon a silicon oxide layer, and etching back the silicon oxide layer, wherein a silicon oxide side wall is formed on the edge of the active region, and etching back the second silicon nitride layer using the oxide side wall as a mask to expose the semiconductor substrate.

11. The method of claim 10, wherein step (3) further comprises the step of etching back the second silicon nitride layer and a portion of the semiconductor substrate using the oxide side wall as a mask, wherein a shallow recess is formed in the semiconductor substrate.

12. A method for isolating elements in a semiconductor device comprising the steps of:
   (1) forming a first silicon oxide layer on a silicon substrate, forming a stress-relieving layer on the first silicon oxide layer, and forming a first silicon nitride layer on the stress-relieving layer;
   (2) patterning an active region and a field region, wherein the first silicon oxide layer, the stress-relieving layer and the first nitride layer are removed in the field region and remain in the active region;
   (3) forming a second silicon nitride layer on the overall surface and forming thereon a second silicon oxide layer;
   (4) etching back the second silicon oxide layer, wherein a silicon oxide side wall is formed on the edge of the active region pattern, and etching back the second silicon nitride layer using the silicon oxide side wall as a mask to expose a portion of the silicon substrate in the field region;
   (5) etching the exposed portion of the silicon substrate in the field region to form a recess;
   (6) removing the silicon oxide side wall, and performing a channel stop field ion implantation; and
   (7) performing a field oxidation to form a field oxide layer in the field region.

13. The method of claim 12, wherein the stress-relieving layer comprises polysilicon.

14. The method of claim 12, wherein at step (4), the second silicon nitride layer and a portion of the silicon substrate are etched back using the silicon oxide side wall as a mask, wherein a shallow recess is formed in the silicon substrate.

15. The method of claim 13, wherein at step (4), the second silicon nitride layer and a portion of the silicon substrate are etched back using the silicon oxide side wall as a mask, wherein a shallow recess is formed in the silicon substrate.

16. The method of claim 13, wherein the stress-relieving layer comprises polysilicon formed by a chemical vapor deposition process to a thickness of about 500-1000 Angstroms.

17. The method of claim 13, wherein the first silicon oxide layer is formed by a thermal oxidation process, and the polysilicon layer and the first and second silicon nitride layers are formed by chemical vapor deposition processes.

18. The method of claim 13, wherein the first silicon oxide layer is of a thickness of about 100-200 Angstroms, the polysilicon layer is of a thickness of about 500-1000 Angstroms, the first silicon nitride layer is of a thickness of about 1500-2000 Angstroms, and the second silicon nitride layer is of a thickness of about 300-700 Angstroms.

* * * * *